United States Patent
Heuermann

(10) Patent No.: US 8,126,670 B2
(45) Date of Patent: Feb. 28, 2012

(54) METHOD AND DEVICE FOR CALIBRATING A NETWORK ANALYZER FOR MEASURING AT DIFFERENTIAL CONNECTIONS

(75) Inventor: Holger Heuermann, Stolberg-Breining (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 399 days.

(21) Appl. No.: 12/305,897

(22) PCT Filed: Jun. 13, 2007

(86) PCT No.: PCT/EP2007/005215
§ 371 (c)(1),
(2), (4) Date: Dec. 19, 2008

(87) PCT Pub. No.: WO2007/147511
PCT Pub. Date: Dec. 27, 2007

(65) Prior Publication Data
US 2010/0204941 A1 Aug. 12, 2010

(30) Foreign Application Priority Data
Jun. 21, 2006 (DE) .......................... 10 2006 028 427

(51) Int. Cl.
*G01D 18/00* (2006.01)
*G01D 21/00* (2006.01)

(52) U.S. Cl. ........... 702/85; 73/1.01; 73/865.9; 375/224

(58) Field of Classification Search .................. 73/1.01, 73/432.1, 865.8, 865.9, 866.1; 324/73.1, 324/76.11, 500, 512, 519, 520, 521, 522, 324/523, 525, 527, 534, 537, 750.01, 750.02, 324/762.01, 763.01; 370/541, 525, 241, 370/252; 375/224; 702/1, 57, 64, 66, 67, 702/85, 90, 104, 106, 107, 108, 109, 110, 702/112, 127, 187, 189; 709/223, 224; 714/1, 714/25, 37, 39, 100

See application file for complete search history.

(56) References Cited

U.S. PATENT DOCUMENTS
3,082,374 A * 3/1963 Buuck .......................... 324/73.1
(Continued)

FOREIGN PATENT DOCUMENTS
DE 4332273 A1 * 6/1994
(Continued)

OTHER PUBLICATIONS
International Preliminary Report on Patentability, PCT/EP2007/005215, Mar. 5, 2009, pp. 1-12.
(Continued)

*Primary Examiner* — Edward Cosimano
(74) *Attorney, Agent, or Firm* — Ditthavong Mori & Steiner, P.C.

(57) ABSTRACT

A method for calibrating vectorial network analyzers, which provide exactly n test ports, for the testing of electrical components with differential connections, where several calibration measurements are implemented, and where several different calibration standards are connected to the test ports. In the method, n is a positive integer greater than 1, and exactly one arbitrary test port is used as a reference test port. The following measurements are implemented for the calibration: (n−1) calibration measurements, where the reference test port is connected to every further test port respectively in its own calibration measurement by direct connections or short matched lines of known reflection, length and attenuation, one calibration measurement where all n test ports are terminated by respectively known input impedances of arbitrary transmission properties, and one calibration measurement where all n test ports are terminated by unknown, respectively-identical, reflecting terminations.

22 Claims, 4 Drawing Sheets

U.S. PATENT DOCUMENTS

| | | | | |
|---|---|---|---|---|
| 3,393,301 | A * | 7/1968 | Valstar | 702/109 |
| 3,492,572 | A * | 1/1970 | Jones et al. | 714/740 |
| 5,440,236 | A * | 8/1995 | Schiek et al. | 324/601 |
| 5,442,296 | A * | 8/1995 | Schiek et al. | 324/601 |
| 5,608,330 | A * | 3/1997 | Heuermann et al. | 324/601 |
| 5,666,059 | A * | 9/1997 | Heuermann et al. | 324/601 |
| 5,793,213 | A | 8/1998 | Bockelman et al. | |
| 6,643,597 | B1 * | 11/2003 | Dunsmore | 702/104 |
| 6,853,198 | B2 | 2/2005 | Boudiaf et al. | |
| 7,030,625 | B1 * | 4/2006 | Boudiaf et al. | 324/601 |
| 7,034,548 | B2 * | 4/2006 | Anderson | 324/600 |
| 7,068,046 | B2 * | 6/2006 | Martens et al. | 324/601 |
| 7,130,756 | B2 * | 10/2006 | Heuermann | 702/107 |
| 2004/0095145 | A1 * | 5/2004 | Boudiaf et al. | 324/601 |
| 2004/0201383 | A1 * | 10/2004 | Anderson | 324/600 |
| 2004/0246004 | A1 * | 12/2004 | Heuermann | 324/601 |
| 2006/0103392 | A1 | 5/2006 | Martens et al. | |
| 2010/0204943 | A1 * | 8/2010 | Heuermann | 702/85 |

FOREIGN PATENT DOCUMENTS

| | | |
|---|---|---|
| DE | 4404046 A1 * | 9/1994 |
| DE | 4405211 A1 * | 12/1994 |
| DE | 4433375 A1 * | 4/1995 |
| DE | 199 18 960 A1 | 11/1999 |
| DE | 203 05 226 U1 | 7/2003 |
| DE | 102 35 221 A1 | 2/2004 |
| DE | 10 2004 020 037 A1 | 12/2004 |
| DE | 103 14 811 B4 | 8/2005 |
| DE | 101 06 254 B4 | 12/2006 |
| DE | 199 18 697 B4 | 8/2007 |
| DE | 102007028725 A1 * | 12/2008 |
| GB | 2 292 616 A | 2/1996 |

OTHER PUBLICATIONS

Heuermann, H., "Hochfrequenztechnik, Lineare Komponenten hoch integrierter Hochfrequenzschaltungen" (English translation is—"High Frequency Technology, Linear components of highly-integrated high-frequency circuits"), Vieweg-Verlag, 2005, ISBN 3-52803980-9, Chapter 5, pp. 103-148 (cited in specification on p. 3 lines 16-17, p. 22 lines 4-5, p. 24 lines 7-9).

Heuermann, H., "Sichere Verfahren zur Kalibrierung von Netzwerkanalysatoren fur koaxiale und planare Leitungssysteme" (English translation is—"Secure Methods for Calibration of Network Analysers for Coaxial and Planar Line Systems"), Dissertation, Institut High Frequency Technology, Ruhr-Universitat, Bochum, 1995, pp. 1-144 (cited in specification on p. 17 lines 13-15, p. 20 lines 2-4).

International Search Report, WO 2007/147511 A3, Rohde & Schwarz GmbH & Co. KG, Dec. 27, 2007, pp. 1-8.

* cited by examiner

METHOD AND DEVICE FOR CALIBRATING A NETWORK ANALYZER FOR MEASURING AT DIFFERENTIAL CONNECTIONS

CROSS-REFERENCE TO RELATED APPLICATION

The present application claims priority to German Application No. 10 2006 028 427.5, filed on Jun. 21, 2006, and PCT Application No. PCT/EP2007/005215, filed on Jun. 13, 2007, the entire contents of which are herein incorporated by reference.

BACKGROUND OF THE INVENTION

1. Field of the Invention

The invention relates to a method and a device for calibrating vectorial network analyzers for use with electrical components with differential connections.

2. Discussion of the Background

In precision electronics, vectorial network analyzers (VNA) are used from low frequencies through to high-frequency technology in the GHz range for precision testing of electronic components and components in active and passive circuits and component groups.

A VNA records the so-called scattering parameters of n-port networks (n=1, 2, ... ), which are optionally converted into 2n-pole parameters (for example, Z-parameters or Y-parameters). However, in the case of mid and high frequencies (fast circuits), these recorded data provide very considerable measurement errors. A so-called system-error correction of the VNA is required to ensure that accurate measurements of fast electronic components can be implemented at all. The measurement accuracy of VNAs depends primarily on the availability of a method for system-error correction. In the context of system-error correction, devices under test, which are known either partially or in their entirety, are tested with regard to reflection and/or transmission behavior within a so-called calibration process. This is known, for example, from DE 199 18 960 A1. Correction data (so-called error parameters or coefficients) are obtained from these measured values via special computational methods. Using these correction data and a corresponding correction calculation, measured values, from which system errors of the VNA and supply lines (couplings=crosstalk, error matchings-reflections) have been removed, can be obtained for any required device under test.

The electrical performance of components and circuits in high-frequency technology is conventionally described via the scattering parameters (also referred to as S-parameters). Rather than linking currents and voltages, the scattering parameters link wave values with one another. This form of presentation is particularly well-suited to the physical conditions of high-frequency technology. If required, the scattering parameters can be converted into other electrical-network parameters, which link currents and voltages.

FIG. 1 shows a two-port, which is to be characterized by its scattering matrix [S]. Let the waves $a_1$ and $a_2$ be the waves travelling towards the two-port; and the waves $b_1$ and $b_2$ be the waves accordingly propagated in the opposite direction. The following relationship applies:

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix}$$

One known calibration method for a multi-port model, which is based on the so-called 7-term method, illustrates how the scattering parameters of this so-called 1-mode system can be detected with high precision with network analyzers, which provide a transmitting oscillator.

With passive devices under test, these scattering parameters can be converted into the scattering parameters for components with differential (symmetrical) ports. A full description of these conversions is provided in Heuermann, H., High Frequency Technology, Linear components of highly-integrated high-frequency circuits, Vieweg-Verlag, 2005, ISBN 3-528-03980-9, Chapter 5. This text shows that, alongside the classical ports (also referred to as un-symmetrical, mono-mode ports or single ports), as illustrated in FIG. 1, there are also so-called port pairs, which contain a common-mode port and a differential-mode port. These port pairs are often also referred to as differential or symmetrical ports.

On one hand, components, which provide exclusively port pairs, are introduced in this context by presenting the so-called M-parameters. Only the common-mode and differential modes (2-mode system) occur with these components. Accordingly, the M-matrix for a two-port pair is as follows:

$$\begin{pmatrix} b_1^- \\ b_2^- \\ \hline b_1^+ \\ b_2^+ \end{pmatrix} = \begin{bmatrix} M_{11}^{--} & M_{12}^{--} & M_{11}^{-+} & M_{12}^{-+} \\ M_{21}^{--} & M_{22}^{--} & M_{21}^{-+} & M_{22}^{-+} \\ \hline M_{11}^{+-} & M_{12}^{+-} & M_{11}^{+} & M_{12}^{+} \\ M_{21}^{+-} & M_{22}^{+-} & M_{21}^{+} & M_{22}^{+} \end{bmatrix} \begin{pmatrix} a_1^- \\ a_2^- \\ \hline a_1^+ \\ a_2^+ \end{pmatrix}$$

$a^+$, $b^+$: common-mode waves, $a^-$, $b^-$: differential-mode waves,

On the other hand, components, in which another un-symmetrical mode (3-mode system) occurs in addition to the common-mode and differential modes, are also introduced with the M-parameters. It is shown in the above context how the scattering parameters of a multi-port measurement can be converted into M-parameters.

These results presented in the above context might suggest that 2-mode and 3-mode systems can be characterised in full in electrical terms, provided they are measured with a multi-port network analyzer, of which the measured values are corrected in the mono-mode system according to a method as disclosed in DE 199 18 960 A1. This assumption is also correct insofar as the device under test is a passive device under test. Using a network analyzer, which provides only one signal source, only a passive device under test can be measured without its properties changing.

In the case of an active component, such as an amplifier, with differential connections, the operating point changes dramatically, if the amplifier is driven in an unsymmetrical manner. Accordingly, with this procedure, a differential amplifier provides different M-parameters, which change significantly, especially in the case of a high-level adjustment.

Methods for calibrating network analyzers with two and more transmitting oscillators, especially those which support a differential excitation for the measurement, are so far not conventionally available.

At present, active components with differential connections are measured using baluns. At low frequencies, broadband transformers are used as baluns, and at high frequencies narrow-band baluns are used. The baluns are connected to every port pair. The device under test can therefore be measured at the correct operating point. However, a large number of measurement errors occur with this procedure. For example, only the differential parameters of the device under test are indicated. These parameters are measured for a fixed-impedance termination of the common mode. In the case of the transformer, this is, for example, an open circuit and does not generally correspond to the values, at which the circuit component is to be considered in the circuit as a whole.

Furthermore, every balancing error of the balun appears as a measurement error. The baluns must be very well matched, which is often not the case in practice. In this context, measurement errors are added, which are difficult to calculate. This procedure therefore corresponds de facto to a scalar measurement, such as those used into the 1970s for purely unsymmetrical devices under test.

SUMMARY OF THE INVENTION

The invention is based on providing a method and a device, which allows a calibration of vectorial network analyzers for the testing of electrical components with differential connections without the use of differential calibration standards, and at the same time, combines a low calibration cost with high precision.

In order to calibrate vectorial network analyzers, which provide n test ports, several calibration measurements are carried out. Accordingly, several different calibration standards are connected to the test ports. A series of measurements is implemented for the calibration as follows:

Initially, in a first measurement, starting from a reference test two-port, every further test two-port is contacted in succession by means of a direct connection or short, matched line of known reflection, length and attenuation.

Following this, in a second measurement, all n test ports are terminated respectively by means of known input impedances of arbitrary transmission properties.

In a third measurement, all test ports are terminated by means of unknown, respectively identical, reflecting terminations. In this manner, an accurate, differential calibration can be implemented with a minimum number of implemented calibration measurements.

In a further method for calibrating vectorial network analyzers, which provide at least n>3 test ports, several calibration measurements are also carried out. In this context, several different calibration standards are connected to the test ports. A series of measurements are implemented for the calibration as follows:

Initially, in a first measurement, starting from a reference-test two-port pair, every further test two-port pair is contacted in succession by means of a direct connection or short, matched line of known reflection, length and attenuation.

Following this, in a second measurement, the two test ports of every test two-port pair are connected to one another by means of a direct connection or short, matched line of known reflection, length and attenuation.

In a third measurement, all unsymmetrical test ports, which are not associated with a test two-port pair, are connected in succession to a reference test port.

Following this, in a fourth measurement, all n test ports are terminated respectively by means of known input impedances of arbitrary transmission properties.

In a third measurement, all test ports are terminated by means of unknown respectively identical, reflecting terminations.

In this manner, an accurate, differential calibration can be implemented with minimum mathematical cost for the correction calculations.

In a third method for calibrating vectorial network analyzers, which provide n test ports, several calibration measurements are also carried out. Accordingly, several different calibration standards are connected to the test ports. A series of measurements is implemented for the calibration as follows:

Initially, in a first measurement, starting from a reference test two-port, every further test two-port is contacted in succession by means of a direct connection or short, matched line of known reflection, length and attenuation.

Following this, in n further measurements, all n test ports are terminated in succession by means of respectively known input impedances of arbitrary transmission properties.

In further measurements, all n test ports are terminated in succession by means of unknown, respectively identical, reflecting terminations. Accordingly, an accurate, differential calibration can be implemented with a minimum number of required calibration standards.

In a fourth method for calibrating vectorial network analyzers, which provide at least n>3 test ports, several calibration measurements are also carried out. Accordingly, several different calibration standards are connected to the test ports. A series of measurements is implemented for the calibration as follows:

Initially, in a first measurement, starting from a reference test two-port pair, every further test two-port pair is contacted in succession by means of a direct connection or a short, matched line of known reflection, length and attenuation.

Following this, in a second measurement, the two test ports of every test two-port pair are connected to one another by means of a direct connection or a short, matched line.

In a third measurement, all unsymmetrical test ports, which are not associated with a test two-port pair, are connected in succession to a reference test port.

Following this, in further measurements, all n test ports are terminated in succession by means of respectively-known input impedances of arbitrary transmission properties.

In further measurements, all n test ports are terminated by means of unknown respectively-identical, reflecting terminations.

Accordingly, an accurate, differential calibration can be implemented with minimum mathematical cost for the correction calculation and with a minimum number of required calibration standards.

For the calibration of relatively-simpler network analyzers, of which the test ports are formed respectively by one independent test point and one common, reference test point, a further calibration measurement is advantageously implemented. Accordingly, all n test ports are terminated by means of known, not-necessarily-identical, reflecting terminations of arbitrary transmission properties. Alternatively, n further calibration measurements can be implemented, wherein all n test ports are terminated in succession by means of known, not-necessarily-identical reflecting terminations of arbitrary transmission properties. In this manner, an expansion of the illustrated method for calibrating network analyzers with a common reference test point is achieved.

In a further method for calibrating relatively-simpler network analyzers, of which the test ports are formed respectively by one independent test point and one common reference test point, further calibration measurements are also advantageously implemented. Accordingly, in a first, further measurement, all n test ports are terminated in succession by means of known, identical impedances. In two further calibration measurements, all n test ports are terminated in succession by means of at least two known, significantly-different, strongly-reflecting terminations of arbitrary transmission properties. In this manner, an expansion of the illustrated method for calibrating network analyzers with a common reference test point is achieved.

During the measurements, the test ports are advantageously excited in succession with a common mode and with a differential mode by at least one transmitting oscillator. Accordingly, reflection parameters and transmission parameters are measured at all of the connections of the vectorial network analyzer connected to the test ports. Error networks, which are used in the correction calculations for the raw measured values, are calculated from the parameters measured in this manner. The error networks in this context contain separate parameters for an excitation with a common mode and with a differential mode. All of the parameters required for the correction calculation in differential form are therefore available.

The differential character of the measurements is achieved by an excitation of the test ports by means of two signal generators, of which the phases are displaced by at least 90°, preferably by approximately 180°. The use of two signal generators allows a particularly accurate adjustment of the phase difference.

Alternatively, the excitation can be implemented, for example, by a single signal generator. For the excitation in the differential mode, the signal of the signal generator is split into two excitation signals. The phase of one of the excitation signals is then displaced by at least 90°, preferably by approximately 180°. As a result, one signal generator can be dispensed with in the structure, thereby reducing the cost of the structure.

All of the methods presented here can be described as true-differential methods (TD methods).

In practice, the transmitting oscillators are driven in such a manner that the signals in each port pair are connected as a common-mode signal in one measurement and as a differential signal in a further measurement. Any unsymmetrical ports are driven only singly. An unsymmetrical multi-port drive can also be used in the calibration (using widely-available unsymmetrical standards).

The advantage of a structure of this kind for a network analyzer in conjunction with the TD method is that the devices under test are measured under conditions and at operating points, which also correspond to subsequent use.

Using these TD methods, all multi-mode devices under test can, for the first time, be measured with a precision, which represents the state-of-the-art for mono-mode scattering parameters.

For the user, handling is exactly as simple as in the context of mono-mode scattering parameters. The measurement rates are disposed within the same range. Broadband measurements can still be made in the normal manner.

One particularly clear advantage of the TD methods is the fact that balancing errors of the transmitting oscillators have no influence on the accuracy of the TD method. Only the slightly-changed properties of the device under test could alter the test results to an extent, which is, however, negligible, given the current possibilities for realization of the balancing properties of the oscillators and the other hardware of the network analyzer.

To some extent, this invention requires network analyzers, which provide 2n test points. By comparison with the mono-mode method, which only requires network analyzers with n−1 test points, this represents a disadvantage with regard to costs. In practice, however, these methods are also used in VNAs with 2n test points because these devices are significantly-more precise and provide improved long-term stability, and because drift effects of the electronic switches have no influence on the quality of measurement of these devices.

BRIEF DESCRIPTION OF THE DRAWINGS

The invention is described below by way of example with reference to the drawings, which represent an advantageous exemplary embodiment of the invention. The drawings are as follows.

DETAILED DESCRIPTION OF EXEMPLARY EMBODIMENTS OF THE INVENTION

Initially, the structure and the circuit according to the invention for the network analyzer to be calibrated will be explained with reference to FIGS. 1-3. Different calibration methods according to the invention will then be illustrated in the sequence of the test arrangements with reference to FIGS. 4-6. FIG. 7 shows the configuration of an alternative network analyzer concept. The description of identical elements in similar drawings has not been repeated in some cases.

Figure 1:
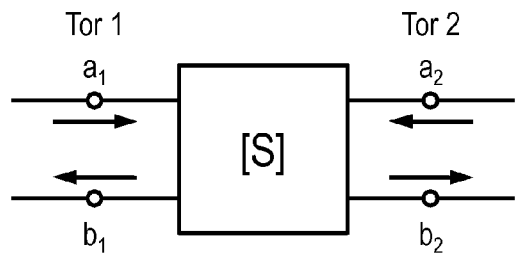
FIG. 1 shows an exemplary circuit diagram of a two-port with four connections.

FIG. 1 shows an exemplary circuit diagram of a two-port, which can be characterized by its scattering matrix [S]. Let the waves $a_1$ and $a_2$ be the waves travelling towards the two-port; and let the waves $b_1$ and $b_2$ be the waves propagated in the opposite direction. The following relationship applies:

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix}$$

Figure 2:
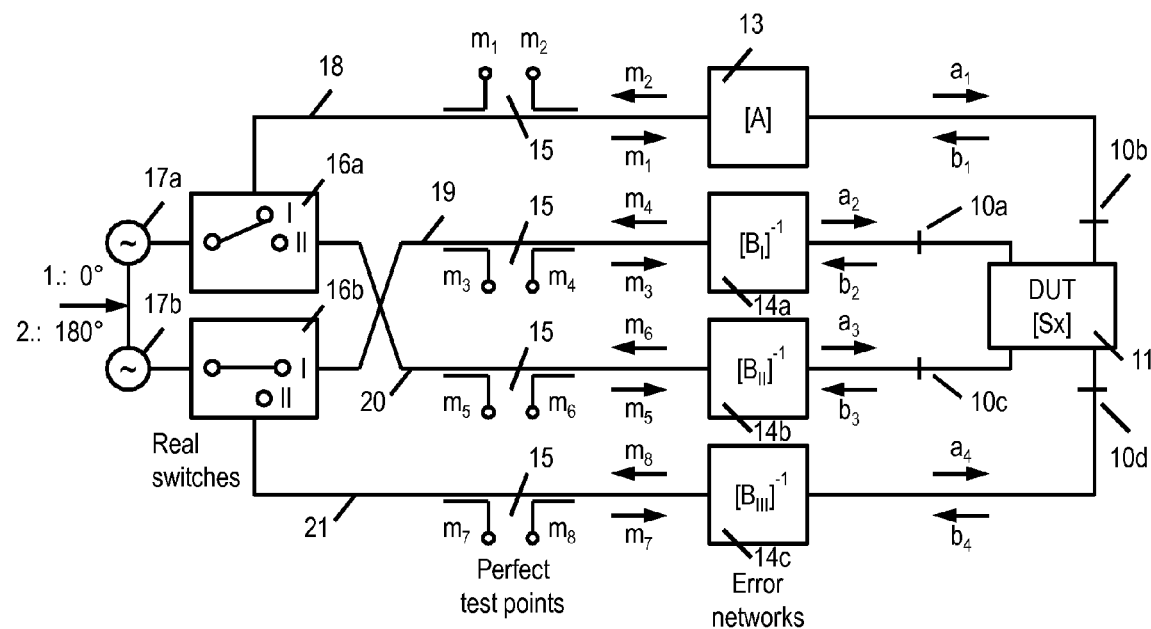
FIG. 2 shows a circuit diagram of a first exemplary embodiment of the calibration device according to the invention.

FIG. 2 illustrates the case, which is particularly relevant in practice, of a 4-port network-analyzer system with two transmitting oscillators in the form of a block-circuit diagram. It is evident that 2n=8 test points 15 are required for the measurement of a two-port pair. FIG. 2 illustrates how a structure of this kind can be realized and provides a basis for the description of the multi-mode methods.

FIG. 2 illustrates how two signals from two sources 17a and 17b are guided to the four branches 18, 19, 20 and 21, in each case via a switch 16a and 16b, of which the properties of reproducibility, reflection, long-term stability and so on do not influence the measurement accuracy, but do influence possible operating-point displacement. The switches provide two switching positions and are driven respectively by an in-phase (0°) and an anti-phase (180°) signal. The measuring points 15, which are assumed to be ideal, each occupy one dimension for the incident and the transmitted wave. The signals of the test points are preferably retrieved in parallel, but, can also be retrieved (sampled) in series, because, with the exception of the switches and oscillators, this test system offers long-term stability.

All of the deterministic non-idealities and incompletenesses of the VNA between switches and tests-port levels in the form of error matching and crosstalk are combined and included in error networks 13, 14a, 14b and 14c. The device under test 11 (DUT) is connected to the vectorial multi-port network analyzer at ports 10a-10d. The ports 10a and 10b can be combined to form a port pair. The same applies for ports 10c and 10d. As a result of the 0°/180° phase displacements of the oscillators at the same amplitude level, the device under test is driven at both port pairs with a common-mode signal and a differential-mode signal.

The TD methods (true-differential) can be subdivided in mathematical terms into three stages:
1. Self calibration,
2. Direct calibration, and
3. System-error correction.

In the first stage "self-calibration", the unknown parameters in the calibration standards are calculated. The transmission values of the second (match-) standards and the reflections and transmission values of the third (reflect/short/open) standards may be unknown.

For this purpose, trace and determinant properties of imaging matrices are used, as explained in Heuermann, H., Secure Methods for Calibration of Network Analysers for Coaxial and Planar Line Systems, Dissertation, Institute for High-Frequency Technology, Ruhr-University, Bochum, 1995, ISBN 3-8265-1495-5. By contrast with other publications, the match-calibration standards are not taken into consideration in the mathematics with ideal properties (S11=0). This means that the resulting equations for calculating reflection values of the self-calibration standards (e.g. reflect=R) are considerably longer than indicated in the literature. However, inter alia, with regard to considerations of non-ambiguity, these equations do not differ from the conventional solutions of the self-calibration calculations.

With regard to the self-calibration standards of the TD methods, the following points apply:
1. The phase of the reflection standard R must be known only at ±90°. Further information is not required. In practice, a real short circuit and an open circuit are used. Deviations from an ideal short circuit or open circuit have no influence on the accuracy of the measurement.
2. If a matched standard with finite transmission is used as the second calibration standard, either the phase of the transmission at ±90° must be known, or the value must provide a noticeable transmission attenuation. Further information is not required. In practice, a short precision line is often used, the length of which must differ from n*180°.

In the second stage "direct calibration", the error coefficients are calculated.

For this purpose, all electrical properties of the calibration standards must be known (e.g. in the form of scattering parameters).

A distinction is made between two classes of known calibration standards:
1. Absolute standards; and
2. So-called postulated standards.

The absolute standards are physical components, of which the electrical behavior is known from precision manufacture and calculation or from the self-calibration process. Four absolute standards are generally used for the TD methods:
1. The line standard L must be known in full for the TD method (after self-calibration), but can provide a transmission attenuation and a finite reflection attenuation.
2. The impedance standards M must be known in full, but may be different in the TD method. Standards of this kind are often referred to as "transfer-match" standards.
3. The reflection standards S, O or R must be known in full (after self-calibration), but in the TD method, do not need to observe the ideal values of a short circuit or an open circuit. These standards are often referred to as "transfer-reflect" standards.
4. The absolute standards S and O are accurately described by the manufacturer and these values are used directly.

Postulated standards are not physical components. In each case, they relate to the behavior of contacted test ports in the reference plane. The best-known, postulated standard is the through-connection. The properties of perfect matching ($S_{ii}=0$) and perfect transmission ($S_{ij}=1$) are allocated to the through-connection (direct connection of two test ports). A second known, postulated standard can be found in the literature for the so-called 15-term method, e.g. in Heuermann, H., Secure Methods for Calibration of Network Analysers for Coaxial and Planar Line Systems, Dissertation, Institute for High-Frequency Technology, Ruhr-University, Bochum, 1995, ISBN 3-8265-1495-5. This forms two open circuits and provides perfect insulation. For measuring multi-mode objects, a further postulated standard can now be introduced: if the two test ports of a port pair are connected together, this represents a perfect open circuit for a common-mode signal, and a perfect short circuit for a differential-mode signal. In the TD methods, this new, postulated standard is used for the direct calibration.

In the claims, a through-connection is apparently implemented, however, the mathematical model relates to the postulated standards for short-circuit and open circuit with perfect insulation. Accordingly, these are also referred to below as a "connection of the test ports". With these new, postulated two-port calibration standards, a series of two-port calibrations is implemented mathematically, after which the error coefficients of the error networks, for example, 13 and 14a-14c are known.

In order to determine the error matrices, which are based on the classical 7-term model (the description 7-term model originates from the two-port calibration, in which the associated 2*2 error networks [A] and [B$_1$] contain a total of 7 error terms, because one of the 8 values contained can always be set to 1), a two-port calibration is implemented between the reference port with the error network [A] and the port with the error network [B$_1$]. In this case, the connection of the two test ports has the character, in M-parameters, of a postulated short-circuit for the differential wave and of a postulated open circuit for the common-mode wave, but has the character of a through-connection for the S-parameters used in the calibration.

After this, in each case, one two-port calibration is implemented between the reference port 10b with the error network [A] and the port 10d with the error network [B$_{III}$] and the ports 10a and 10c for the example indicated in FIG. 2. In this case, the connection of the test ports has the character of a postulated through-connection.

Figure 3:
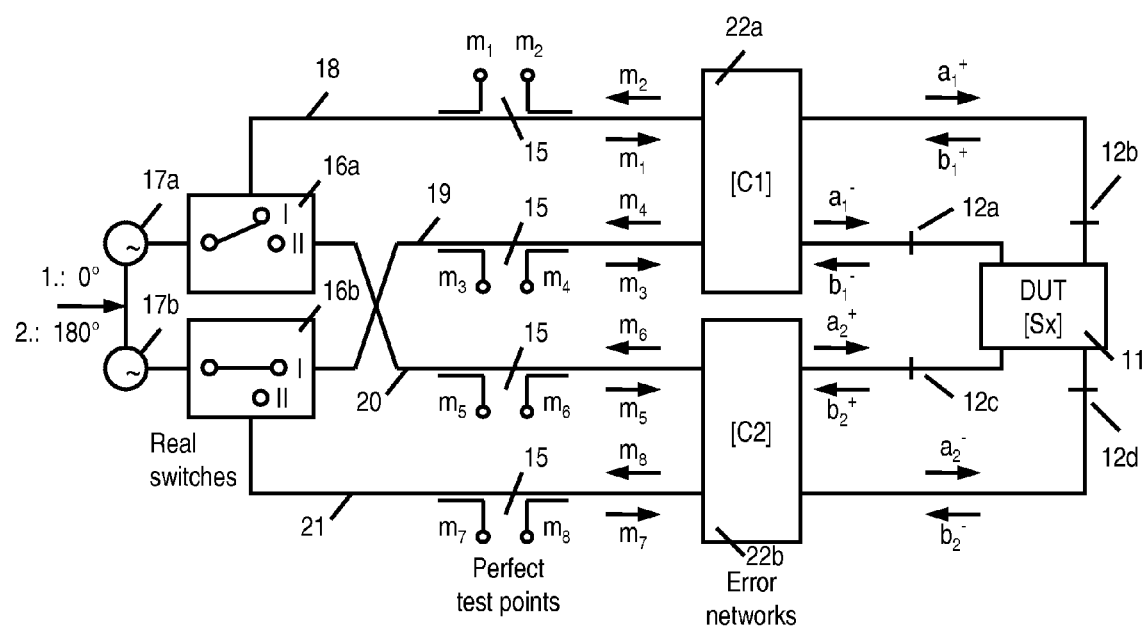
FIG. 3 shows a circuit diagram of a second exemplary embodiment of the calibration device according to the invention.

For the model according to FIG. 2, the calibration leads to error coefficients, which are linked with the S-matrix, and, for the model according to FIG. 3, leads to error coefficients, which are linked to the M-parameters. The first will be referred to below as an "S-parameter calibration", and the latter as a "direct calibration".

In the third stage of "system-error correction", the test data of an unknown device under test are corrected with reference to the errors of the VNA and the supply lines. From the current perspective, there are two relevant approaches for the derivation of the mathematical solution for this problem. In both cases, the test points must be realized using an unsymmetrical circuit technology as provided by the prior art. There are no differences between these two approaches with regard to the requirements for the technical structure of the multi-mode network analyzer.

Approach 1 (after the S-parameter calibration) approaches the problem as shown in FIG. 2. This approach uses the wave values $a_i$ and $b_i$ as auxiliary values and calculates the multi-mode parameters only via a transformation as indicated in Heuermann, H., High-frequency Technology, Linear components of highly-integrated high-frequency circuits, Vieweg Verlag, 2005, ISBN 3-528-03980-9. By contrast with the known 7-term multi-port methods, for port pairs, two waves are imitated once in phase and once in phase opposition. Although the system operates mathematically in the first stage using multi-port S-parameters, two-port pairs are investigated only with excitations from common-mode and differential-mode waves. This approach has the disadvantage that the number of calculations to be implemented is much larger than with the second approach. However, it has the advantage that it is compatible with known multi-port calibration methods, in which the error networks [A] and [$B_i$] must also be calculated.

The starting point for the mathematical description of Approach 1 is provided by the error model presented in FIG. 2. For the sake of simplicity, the mathematical derivation will be implemented only for the case, which is relevant in practice, of measuring symmetrical two-ports (so-called two-port pairs with an input port pair and an output port pair). The generalization of this procedure to additional port pairs can be implemented in a simple manner, by expanding both switches respectively with further output ports and by taking into consideration for each further port pair of the device under test two error networks and four additional test points. Additional unsymmetrical ports (so-called single ports) can be included by providing one further output port at each switch and taking into consideration one error network and two additional test points for each further port of the device under test.

With regard to the paragraphs below, it is advantageous to begin the mathematical formulation of the error two-ports in the inverse form of the indicated transmission parameters:

$$[G]=[A]^{-1}, [H_i]=[B_i]^{-1}, i=1,2 \qquad (2)$$

wherein the following relationships apply for the inputs and outputs in the error networks:

$$\begin{pmatrix} b_1 \\ a_1 \end{pmatrix} = [G] * \begin{pmatrix} m_1 \\ m_2 \end{pmatrix}, \begin{pmatrix} a_i \\ b_i \end{pmatrix} = [H_i] * \begin{pmatrix} m_{2i-1} \\ m_{2i} \end{pmatrix} \qquad (3)$$

These equations can be resolved according to the wave values $a_i$ and $b_i$ and, for the four-port network according to FIG. 2, can be inserted into the equation:

$$\begin{pmatrix} b_1 \\ b_2 \\ b_3 \\ b_4 \end{pmatrix} = [Sx] \begin{pmatrix} a_1 \\ a_2 \\ a_3 \\ a_4 \end{pmatrix} \qquad (4)$$

In this context, the values of one matrix column are obtained for every switch position, which ultimately leads to a linear equation system consisting of two n*n measured-value matrices and the n*n scattering matrix. If this equation system is resolved according to the [Sx] matrix, the error-corrected scattering parameters of an n-port are obtained.

Using the conversions provided in Heuermann, H., High-Frequency Technology, Linear components of highly-integrated high-frequency circuits, Vieweg Verlag, 2005, ISBN 3-528-03980-9, it is then possible to calculate the multi-mode parameters from these accurate scattering parameters. This final calculation stage is in fact extremely time-consuming with regard to calculation time, but simplifies the programming costs for a standard VNA, from which it is also expected that it can implement multi-port scattering-parameter measurements.

This time-consuming calculation stage is not required, if the procedure according to Approach 2 is selected.

Approach 2 (after direct calibration) approaches the problem as presented in FIG. 3. This approach uses the wave parameters $a^+_i$ and $b^+_i$ of the common-mode wave and wave parameters $a^-_i$ and $b^-_i$ of the differential wave and calculates the multi-mode parameters directly via the error correction with the error networks [C1] and [C2], identified by reference numerals 22a and 22b, respectively. The device under test 11 (DUT) is connected to the vectorial multi-port network analyzer at ports 12a-12d. The ports 12a and 12b can be combined to form a port pair. The same applies for ports 12c and 12d.

The latter in fact each contain 16 values, but each with only 8 unknown error coefficients. Since these can once again be related to one value, 7+8=15 unknown error coefficients are contained in FIG. 3. FIG. 2 contains 3 error coefficients for the error network [A] and in each case 4 coefficients for the [Bi] error networks, and therefore also 15 error coefficients. The coefficients of the error networks [A] and [Bi] can be converted into the coefficients of the error networks [Ci]. Accordingly, a direct and therefore rapid error correction can also be implemented after one S-parameter calibration and one additional conversion of the error coefficients implemented only once. The correction calculation is implemented in a similar manner to that indicated for Approach 1.

Figure 4:
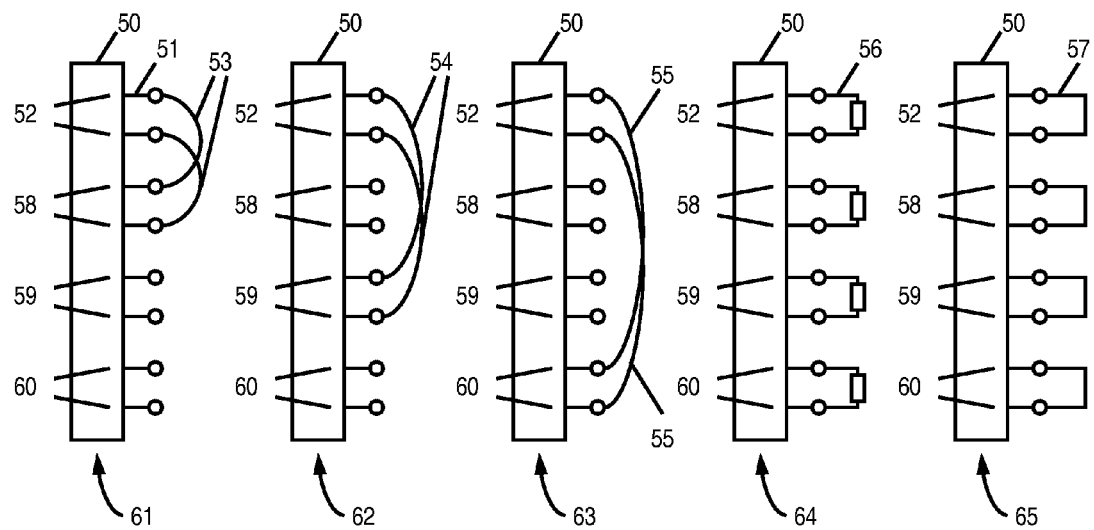
FIG. 4 shows a first exemplary sequence of calibration measurements at the test ports of a vectorial network analyzer with four test ports.

FIG. 4 shows a first exemplary sequence of calibration measurements at the test ports of a vectorial network analyzer 50 with 4 test ports. The various presentations of the network analyzer 50 show mutually-successive stages 61-65 of the calibration measurement. The first stage 61 of a calibration measurement is illustrated in the network analyzer 50. A reference two-port 52, which contains a test point 51, is connected by two through-connections 53 to a further test two-port 58. In further stages 62 and 63, the reference two-port 52 is connected by two through-connections 54, 55 to all further test two-ports 59, 60, respectively. Stages 64 and 65 show the simultaneous termination of all of the test two ports 52, 58, 59, 60 with different terminations 56, 57. In stage 65, the terminations 57 are realized by impedances.

Figure 5:
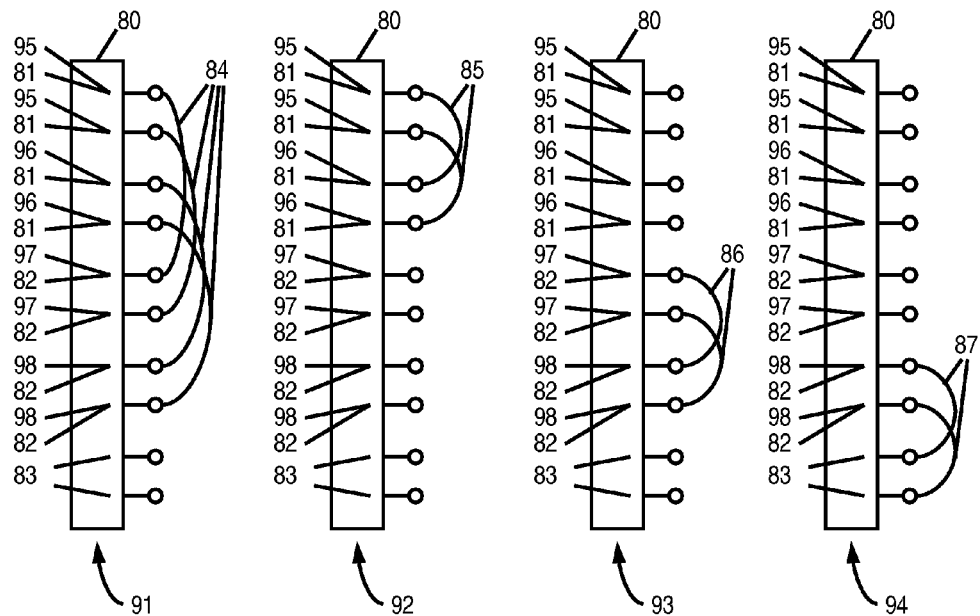
FIG. 5 shows a second exemplary sequence of calibration measurements at the test ports of a vectorial network analyzer with five test ports.

FIG. 5 shows a second exemplary sequence of calibration measurements at the test ports of a vectorial network analyzer 80 with 5 test ports. Initially, in stage 91, a reference test two-port pair 81 is connected to a second test two-port pair 82 by a through-connection 84. In stage 92, test two-port pairs 95 and 96, associated with the reference test two-port pair 81, are connected by a through-connection 85. Similarly, in stage 93, test two-port pairs 97 and 98, associated with the second test two-port pair 82, are connected by a through-connection 86. In a last stage 94, an unsymmetrical test two-port pair 83 is connected by of a through-connection 87 to a reference test two-port pair 98.

Figure 6:
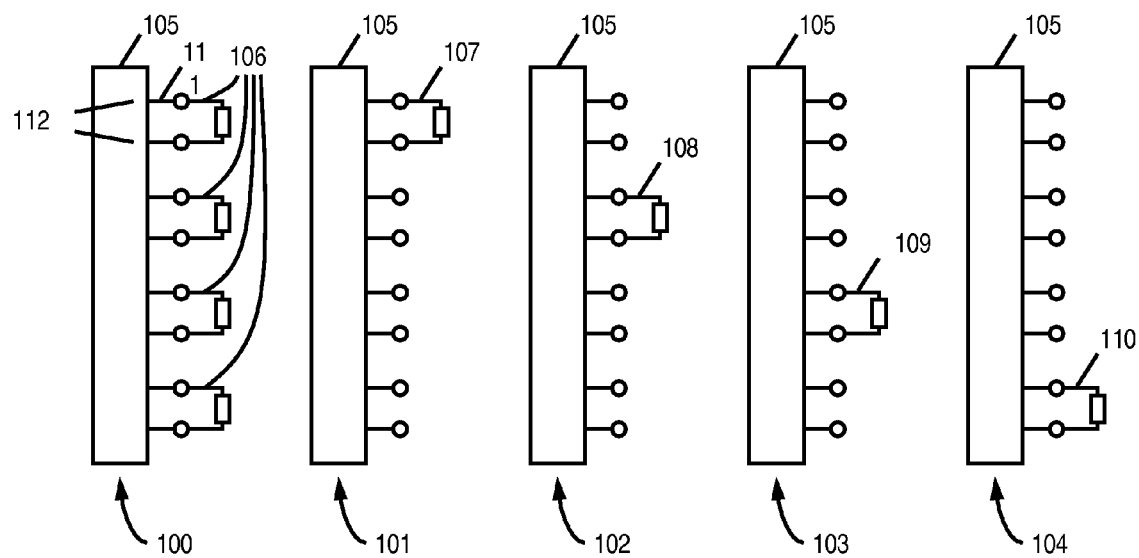
FIG. 6 shows the possibility of replacing one calibration measurement with the connection of n calibration standards by n calibration measurements with the connection of one calibration standard.
Figure 7:
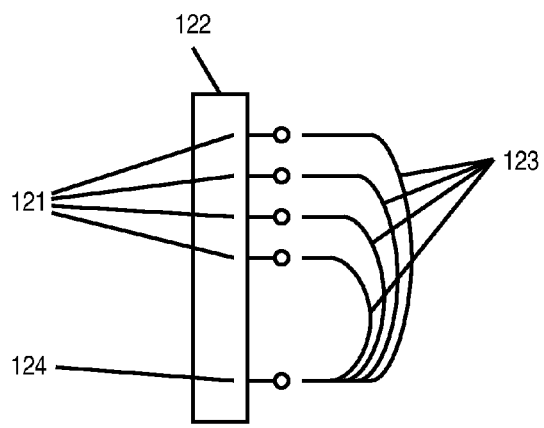
FIG. 7 shows the test ports of an exemplary alternative network analyzer with n test ports and n+1 test points.

FIG. 6 shows the possibility of substituting one calibration measurement with the connection of n calibration standards with n calibration measurements with the connection of one calibration standard. In stage 100, all of the test ports 112 of a network analyzer 105 are terminated at test points 111 with impedances 106. In stages 101 to 104, the alternative possibility is presented of terminating the test ports in succession with an impedance 107 to 110.

FIG. 7 illustrates test ports 123 of an exemplary alternative network analyzer 122 with n test ports and n+1 test points. The network analyzer 122 has at its disposal independent test points 121 and a common reference test point 124. The test ports 123 are formed by using respectively one independent test point 121 and the common reference test point 124.

Reference should finally be made to the fact that, alongside the transmission/switchover concept already presented, a further simple realization is possible. It is possible to use n transmitting oscillators directly. In this case, no switches are required. Furthermore, it is possible to replace the two oscillators with one oscillator, one signal divider and a switchable phase shifter. However, this is only meaningful with a narrowband realization of a VNA.

Certain methods described herein differ from other methods to the extent that the former methods require one through-connection measurement fewer; while the latter methods contain every path relevant for differential measurements.

Certain methods described herein differ from other methods to the extent that, in the latter methods, with regard to the minimal case, only two different single-port standards are used alongside the through-connection.

The invention can also be further developed by using all of the realization options for the calibration standards known as the 7-term method. See Heuermann, H., Secure Methods, mentioned above.

With such low demands on the calibration standards, the multi-mode calibration methods according to the invention are ideal for use with automatic calibrations of VNAs in coaxial environments. For mono-mode two-port calibrations, algorithms and associated switching networks are already operated by several manufacturers. In the case of multi-mode multi-port calibrations, the number of contacts of the calibration standards is considerably greater, which costs time and money and is associated with an increased risk of error.

In the case of multi-mode multi-port calibration, this disclosure relates only to the use of common-mode and differential modes in (quasi-) TEM line systems, consideration of which is particularly relevant to the present state of technology. However, these methods can be extended to any required microwave mode. For example, these methods can also be used for several modes in overhead cables and in free space.

The invention is not restricted to the exemplary embodiment presented. As already mentioned, for example, different calibration standards can be used. All of the features described above or illustrated in the drawings can be combined with one another in any required manner.

I claim:

1. A method for calibrating vectorial network analyzers, which provide exactly n test ports, for testing of electrical components with differential connections, wherein several calibration measurements are implemented, wherein several different calibration standards are connected to the test ports, wherein n is a positive integer greater than 1, wherein exactly one arbitrary test port is used as a reference test port, wherein said method comprises:
    (n−1) calibration measurements, wherein the reference test port is connected to every further test port respectively in its own calibration measurement by direct connections or short matched lines of known reflection, length and attenuation;
    one calibration measurement, wherein all n test ports are terminated by respectively known input impedances of arbitrary transmission properties; and
    one calibration measurement, wherein all n test ports are terminated by unknown, respectively-identical, reflecting terminations.

2. A method for calibrating vectorial network analyzers, which provide exactly n test ports, for testing of electrical components with differential connections, wherein several calibration measurements are implemented, wherein several different calibration standards are connected to the test ports, wherein n is a positive integer greater than 3, wherein respectively two arbitrary test ports form a test-port pair, wherein each test port is associated with a maximum of one test-port pair, wherein exactly one arbitrary test port associated with one test-port pair is used as a reference test port, wherein exactly one arbitrary test-port pair is used as a reference test-port pair, wherein said method comprises:
    performing calibration measurements, wherein a reference test-port pair is connected to every further test-port pair respectively in its own calibration measurement by direct connections or short matched lines of known reflection, length and attenuation;
    performing calibration measurements, wherein the two test ports of every test-port pair are connected to one another each in its own calibration measurement by direct connections or short matched lines of known reflection, length and attenuation;
    performing calibration measurements, wherein every test port, which is not associated with a test-port pair, is connected respectively in its own calibration measurement by direct connections or short matched lines of known reflection, length and attenuation to the reference test port;
    performing one calibration measurement, wherein all n test ports are terminated by respectively-known input impedances of arbitrary transmission properties; and
    performing one calibration measurement, wherein all n test ports are terminated by unknown respectively-identical reflecting terminations.

3. The method according to claim 1 or 2,
wherein the test ports of the network analyzer are formed in each case by an independent test point and a common reference test point, and
wherein a further calibration measurement is implemented, wherein all n test ports are terminated by known, not-necessarily-identical reflecting terminations of arbitrary transmission properties.

4. The method according to claim 1 or 2,
wherein the test ports of the network analyzer are formed respectively by an independent test point and a common reference test point, and
wherein n further calibration measurements are implemented, wherein all n test ports are terminated each in its own calibration measurement by known, not-necessarily-identical reflecting terminations of arbitrary transmission properties.

5. The method according to claim 1 or 2,
wherein the n test ports of the network analyzer are formed respectively by an independent test point and a common reference test point,
wherein further calibration measurements are implemented, wherein all n test ports are terminated each in its own calibration measurement by known identical impedances, and
wherein two further calibration measurements are implemented, wherein all n test ports are terminated each in its own calibration measurement by at least two known, significantly-different, strongly-reflecting terminations of arbitrary transmission properties.

6. The method according to claim 1 or 2,
wherein at least one excitation of at least one of the n test ports is implemented by at least one transmitting oscillator within one calibration measurement in succession with a common mode and with a differential mode.

7. The method according to claim 1 or 2,
wherein reflection parameters and transmission parameters are measured at all of the connections of the vectorial network analyser connected to the n test ports,
wherein error networks are calculated from the measured parameters,
wherein error networks are represented by matrices, which contain the data necessary for a correction calculation of raw measured values, and
wherein the error networks contain separate parameters for the excitation with a common mode and a differential mode.

8. The method according to claim 1 or 2,
wherein the excitation is implemented by two signal generators, and
wherein the phases of the excitation signals are displaced at least by 90°, preferably by approximately 180°.

9. The method according to claim 1 or 2,
wherein the excitation is implemented by a signal generator,
wherein, upon excitation with a differential mode, the excitation signal is split into two excitation signals, and
wherein the phase of one of the two excitation signals is displaced by at least 90°, preferably by approximately 180°.

10. A method for calibrating vectorial network analyzers, which provide exactly n test ports, for testing of electrical components with differential connections, wherein several calibration measurements are implemented, wherein several different calibration standards are connected to the test ports, wherein n is a positive integer greater than 1, wherein exactly one arbitrary test port is used as a reference test port, wherein said method comprises: performing (n−1) calibration measurements, wherein the reference test port is connected to every further test port respectively in its own calibration measurement by direct connections or short matched lines of known reflection, length and attenuation;
performing n calibration measurements, wherein all n test ports are terminated each in its own calibration measurement by at least one known input impedance of arbitrary transmission properties; and
performing n calibration measurements, wherein all n test ports are terminated each in its own calibration measurement by identical, not-necessarily-known reflecting terminations.

11. A method for calibrating vectorial network analyzers, which provide n test ports, for testing of electrical components with differential connections, wherein several calibration measurements are implemented, wherein several different calibration standards are connected to the test ports, wherein n is a positive integer greater than 3, wherein respectively two arbitrary test ports form a test-port pair, wherein every test port is associated with a maximum of one test-port pair, wherein exactly one arbitrary test port associated with one test-port pair is used as a reference test port, wherein exactly one arbitrary test-port pair is used as a reference test-port pair, wherein said method comprises:
performing calibration measurements, wherein the reference test-port pair is connected to every further test-port pair respectively in its own calibration measurement by direct connections or short matched lines of known reflection, length and attenuation;
performing calibration measurements, wherein the two test ports of every test-port pair are connected to one another each in its own calibration measurement by direct connections or short matched lines of known reflection, length and attenuation;
performing calibration measurements, wherein every test port, which is not associated with a test-port pair, is connected each in its own calibration measurement by direct connections or short matched lines of known reflection, length and attenuation to a reference test port;
performing n calibration measurements, wherein all n test ports are terminated each in its own calibration measurement by at least one known input impedance of arbitrary transmission properties; and
performing n calibration measurements, wherein all n test ports are terminated each in its own calibration measurement by identical, not-necessarily-known reflecting terminations.

12. A device for calibrating vectorial network analyzers, which provide exactly n test ports, for testing of electrical components with differential connections, with several different calibration standards and at least one transmitting oscillator, wherein several calibration measurements can be implemented with the device, wherein the several different calibration standards can be connected to the test ports, wherein n is a positive integer greater than 1, wherein exactly one arbitrary test port can be used as a reference test port, wherein said device for calibration is configured to:
perform (n−1) calibration measurements, wherein the reference test port is connected to every further test port respectively in its own calibration measurement by direct connections or short matched lines of known reflection, length and attenuation;
perform one calibration measurement, wherein all n test ports are terminated by respectively known input impedances of arbitrary transmission properties; and
perform one calibration measurement, wherein all n test ports are terminated by unknown, respectively-identical, reflecting terminations.

13. A device for calibrating vectorial network analyzers, which provide exactly n test ports, for testing of electrical components with differential connections, with several different calibration standards and at least one transmitting oscillator, wherein several calibration measurements can be implemented with the device, wherein the several different calibration standards can be connected to the test ports, wherein n is a positive integer greater than 3, wherein respectively two arbitrary test ports form a test-port pair, wherein each test port is associated with a maximum of one test-port pair, wherein exactly one arbitrary test port associated with one test-port pair is used as a reference test port, wherein exactly one arbitrary test-port pair can be used as the reference test-port pair, wherein said device for calibration is configured to:
perform calibration measurements, wherein a reference test-port pair is connected to every further test-port pair respectively in its own calibration measurement by direct connections or short matched lines of known reflection, length and attenuation;
perform calibration measurements, wherein the two test ports of every test-port pair are connected to one another each in its own calibration measurement by direct connections or short matched lines of known reflection, length and attenuation;

perform calibration measurements, wherein every test port, which is not associated with a test-port pair, is connected each in its own calibration measurement to the reference test port;

perform one calibration measurement, wherein all n test ports are terminated by respectively-known input impedances of arbitrary transmission properties; and perform one calibration measurement, wherein all n test ports are terminated by unknown respectively-identical reflecting terminations.

14. The device according to claim 12 or 13, wherein the n test ports of the network analyzer are formed in each case by an independent test point and a common reference test point, and wherein a further calibration measurement can be implemented, wherein all n test ports are terminated by known, not-necessarily-identical reflecting terminations of arbitrary transmission properties.

15. The device according to claim 12 or 13, wherein the n test ports of the network analyzer are formed respectively by an independent test point and a common reference test point, and wherein n further calibration measurements can be implemented, wherein all n test ports are terminated each in its own calibration measurement by known, not-necessarily-identical reflecting terminations of arbitrary transmission properties.

16. The device according to claim 12 or 13, wherein the n test ports of the network analyzer are formed respectively by an independent test point and a common reference test point, wherein a further calibration measurement can be implemented, wherein all n test ports are terminated each in its own calibration measurement by known identical impedances, and wherein two further calibration measurements can be implemented, wherein all n test ports are terminated each in its own calibration measurement by at least two known, significantly-different, strongly-reflecting terminations of arbitrary transmission properties.

17. The device according to claim 12 or 13, wherein at least one excitation of at least one of the n test ports is implemented by at least one transmitting oscillator within one calibration measurement in succession with a common mode and with a differential mode.

18. The device according to claim 12 or 13, wherein reflection parameters and transmission parameters can be measured with the device at all of the connections of the vectorial network analyzer connected to the n test ports, wherein the device provides a processor, which calculates error networks from the measured parameters, wherein the error networks are represented by matrices, which contain the data necessary for a correction calculation of raw measured values, and wherein the error networks contain separate parameters for the excitation with a common mode and a differential mode.

19. The device according to claim 12 or 13, wherein the excitation is implemented by two signal generators, and wherein the phases of the excitation signals are displaced at least by 90°, preferably by approximately 180°.

20. The device according to claim 12 or 13, wherein the excitation is implemented by a signal generator, wherein, upon excitation with a differential mode, the excitation signal is split into two excitation signals, and wherein the phase of one of the two excitation signals is displaced by at least 90°, preferably by approximately 180°.

21. A device for calibrating vectorial network analyzers, which provide exactly n test ports, for testing of electrical components with differential connections, with several different calibration standards and at least one transmitting oscillator, wherein several calibration measurements can be implemented with the device, wherein the several different calibration standards can be connected to the test ports, wherein n is a positive integer greater than 1, wherein exactly one arbitrary test port can be used as a reference test port, wherein said device for calibration is configured to:

perform (n−1) calibration measurements, wherein the reference test port is connected to every further test port respectively in its own calibration measurement by direct connections or short matched lines of known reflection, length and attenuation;

perform n calibration measurements, wherein all n test ports are terminated each in its own calibration measurement by at least one known input impedance of arbitrary transmission properties; and perform n calibration measurements, wherein all n test ports are terminated each in its own calibration measurement by identical, not-necessarily-known reflecting terminations.

22. A device for calibrating vectorial network analyzers, which provide exactly n test ports, for testing of electrical components with differential connections, with several different calibration standards and at least one transmitting oscillator, wherein several calibration measurements can be implemented with the device, wherein the several different calibration standards can be connected to the test ports, wherein n is a positive integer greater than 3, wherein respectively two arbitrary test ports form a test-port pair, wherein every test port is associated with a maximum of one test-port pair, wherein exactly one arbitrary test port associated with one test-port pair is used as a reference test port, wherein exactly one arbitrary test-port pair can be used as a reference test-port pair, wherein said device for calibration is configured to:

perform calibration measurements, wherein the reference test-port pair is connected to every further test-port pair respectively in its own calibration measurement by direct connections or short matched lines of known reflection, length and attenuation;

perform calibration measurements, wherein the two test ports of every test-port pair are connected to one another each in its own calibration measurement by direct connections or short matched lines of known reflection, length and attenuation;

perform calibration measurements, wherein every test port, which is not associated with a test-port pair, is connected each in its own calibration measurement to the reference test port;

perform n calibration measurements, wherein all n test ports are terminated each in its own calibration measurement by at least one known input impedance of arbitrary transmission properties; and perform n calibration measurements, wherein all n test ports are terminated each in its own calibration measurement by identical, not-necessarily-known reflecting terminations.

* * * * *